United States Patent
Lagarde et al.

(10) Patent No.: US 7,574,974 B2
(45) Date of Patent: Aug. 18, 2009

(54) DEVICE FOR PRODUCTION OF A PLASMA SHEET

(75) Inventors: Thierry Léon Lagarde, Vif (FR); Ana Lacoste, St Martin le Vinoux (FR); Jacques Pelletier, St Martin D'Heres (FR); Yves Alban-Marie Arnal, Poisat (FR)

(73) Assignee: Centre National de la Recherche Scientifique (CNRS), Paris (FR)

( * ) Notice: Subject to any disclaimer, the term of this patent is extended or adjusted under 35 U.S.C. 154(b) by 342 days.

(21) Appl. No.: 10/516,998

(22) PCT Filed: Jun. 3, 2003

(86) PCT No.: PCT/FR03/01661

§ 371 (c)(1), (2), (4) Date: Aug. 16, 2005

(87) PCT Pub. No.: WO03/103003

PCT Pub. Date: Dec. 11, 2003

(65) Prior Publication Data

US 2006/0086322 A1    Apr. 27, 2006

(30) Foreign Application Priority Data

Jun. 4, 2002    (FR) .................................. 02 06837

(51) Int. Cl.
  *C23C 16/00* (2006.01)
  *C23F 1/00* (2006.01)
  *H01L 21/306* (2006.01)
(52) U.S. Cl. .................. 118/723 MW; 156/345.41

(58) Field of Classification Search ......... 118/723 MW; 156/345.41
See application file for complete search history.

(56) References Cited

U.S. PATENT DOCUMENTS 5,234,565 A * 8/1993 Yoshida ................. 204/298.38

(Continued)

FOREIGN PATENT DOCUMENTS

EP    1075168    2/2001

(Continued)

*Primary Examiner*—Parviz Hassanzadeh
*Assistant Examiner*—Rakesh K Dhingra
(74) *Attorney, Agent, or Firm*—Blakely, Sokoloff, Taylor & Zafman LLP

(57) ABSTRACT

The invention relates to a device for the production of a plasma (16) within a housing comprising means for the generation of energy in the microwave spectrum, for the excitation of the plasma, said means comprise at least one basic plasma excitation device with a coaxial applicator (4) of microwave energy, one of the ends of which is connected to a production source (7) of microwave energy, the other end (8) of which is directed to the gas to be excited within the housing. The device is characterised in that each basic plasma excitation device is arranged in the wall (3) of the housing, each applicator (4) having a central core (5) which is essentially flush with the wall of the housing. The central core and the thickness of the wall (3) of the housing are separated by a space (6) coaxial to the central core, said space being totally filled, at least at the end of each applicator, by a dielectric material (14), such that said material is essentially flush with the level of the wall of the housing.

15 Claims, 5 Drawing Sheets

U.S. PATENT DOCUMENTS

| | | | |
|---|---|---|---|
| 5,368,685 A * | 11/1994 | Kumihashi et al. | 216/70 |
| 5,975,014 A * | 11/1999 | Dandl | 118/723 MW |
| 6,060,836 A * | 5/2000 | Maeno et al. | 315/111.21 |
| 6,114,811 A | 9/2000 | Wu | |
| 6,156,667 A * | 12/2000 | Jewett | 438/715 |
| 6,165,274 A * | 12/2000 | Akiyama et al. | 118/724 |
| 6,279,504 B1 * | 8/2001 | Takaki et al. | 118/723 E |
| 6,401,653 B1 * | 6/2002 | Taniguchi et al. | 118/723 MW |
| 6,407,359 B1 * | 6/2002 | Lagarde et al. | 219/121.43 |

FOREIGN PATENT DOCUMENTS

| | | | |
|---|---|---|---|
| FR | 2702119 | | 9/1994 |
| JP | 2001-102200 | * | 4/2001 |

* cited by examiner

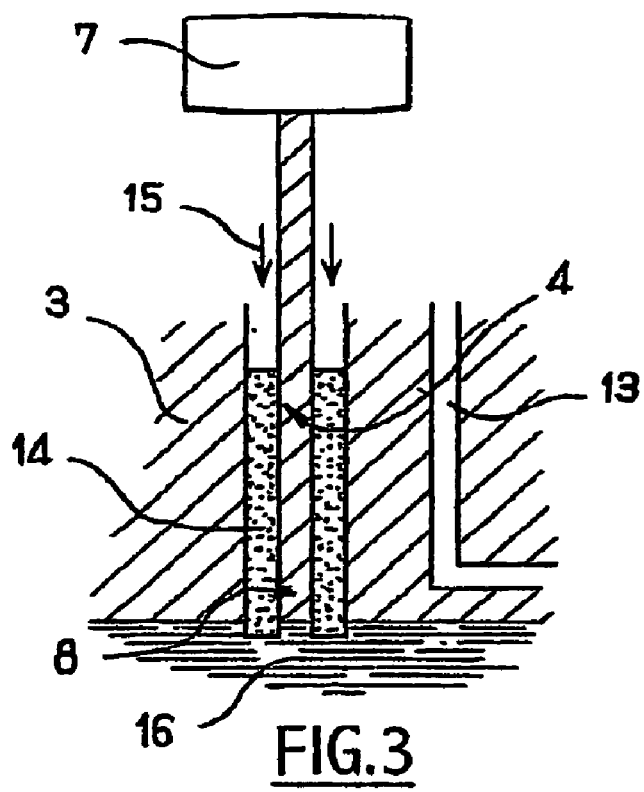
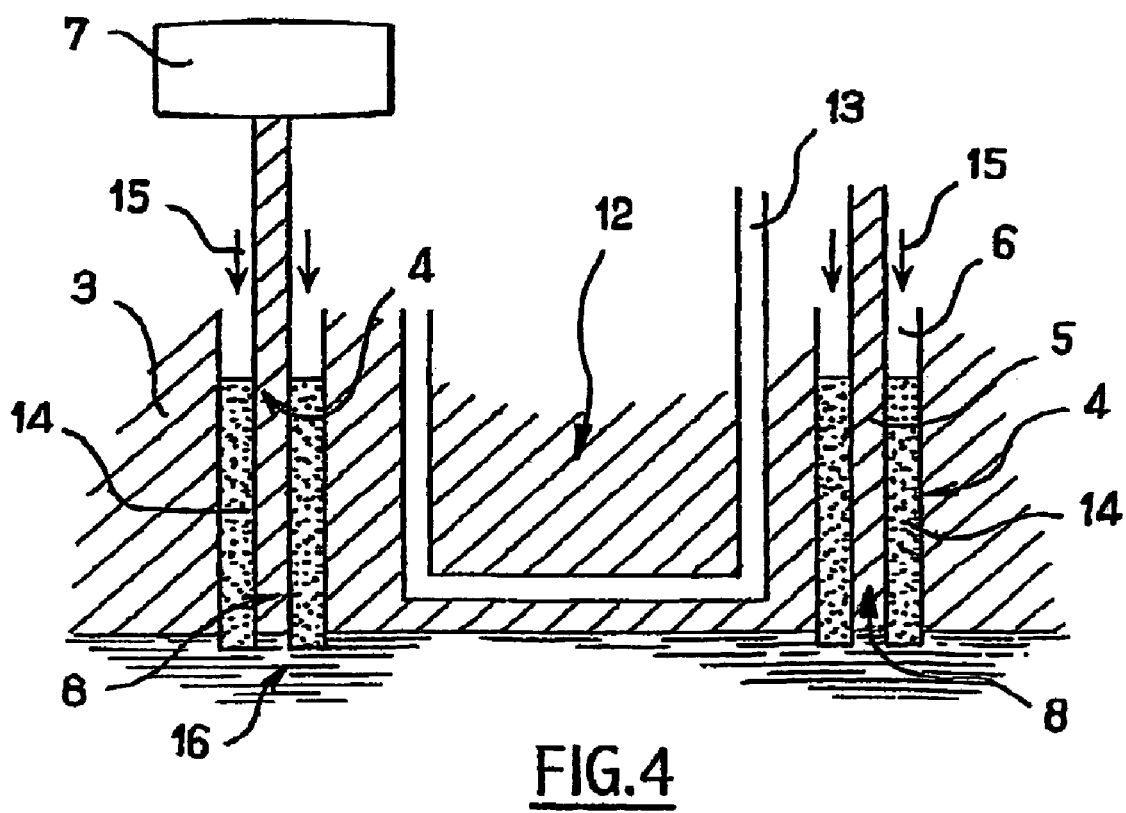

DEVICE FOR PRODUCTION OF A PLASMA SHEET

GENERAL TECHNICAL FIELD OF THE INVENTION

The present invention relates to the general technical field of the production of intermediate pressure plasmas excited by a microwave power.

More precisely, the invention relates to the production of the sheets of dense plasmas, with large dimensions compared with the thickness of the plasma, in the range of medium pressures or intermediate pressures, that is, about a few tenths of Pa to a few thousands of Pa, or of about a few millitorr to a few tens of torr. (1 torr is approximately equal to 133 Pa).

The present invention relates to a wide variety of applications, such as surface treatments, for example the cleaning of surfaces traveling at high speed, and above all, the deposition of diamond films by plasma-enhanced CVD (chemical vapor deposition).

In particular, the invention presents an advantage for applications requiring methods using uniform plasmas at intermediate pressures on large surfaces.

PRIOR ART

All the aforementioned applications require the prior production of a dense and uniform plasma in a chamber, for example in the one in which the application takes place.

It may be recalled that a plasma is a conducting gaseous medium, consisting of electrons, ions and neutral particles, which macroscopically is electrically neutral. A plasma is obtained in particular by the ionization of a gas by electrons.

In general, diamond deposition by plasma CVD is carried out in hydrogen plasmas, containing a small percentage of methane at a total pressure of a few tens of torr, and a substrate temperature of about 600 to 800° C. or more.

The mixture may also contain precursor gases for doping the diamond, or impurities modifying the growth of the diamond.

The plasmas used to deposit diamond films by CVD plasma are generally excited by microwaves. Two types of method for excitation in reactors are available.

1) The plasma can be excited by a surface wave. The diagram of this type of excitor is shown in FIG. 1. The plasma excitor comprises a microwave applicator 1 in the prolongation of which a dielectric tube 2 is fixed, in direct contact with the plasma 3 to be excited. The dielectric tube 2 comprises a bell-mouth 5, which sends the microwaves and the plasma to the substrate 4, which is bathed in the plasma 3.

2) A microwave applicator of the cavity type can be used. The diagram showing the principle of this type of applicator is shown in FIG. 2. In a reactor 1, the plasma 3 is produced in response to an excitation from an antenna 2 used for coupling the microwaves with the cavity. The plasma 3 is excited under a quartz dome 5. The deposition is carried out on a substrate 4 also arranged under the dome 5 and bathed in the plasma 3.

The two types of excitation presented can be used to produce dense plasmas (typically $10^{12}/cm^3$) allowing the deposition of diamond, particularly at a rate of a few microns per hour, on substrates a few centimeters in diameter.

However the above techniques have drawbacks.

In fact, the plasmas produced by these two techniques require power of several kW for their maintenance for a 100 mm diameter substrate, and hence the major drawback of these diamond deposition techniques is the difficulty of reactor scale-up.

As regards the surface wave discharges in FIG. 1, the effective diameter of the plasma can be increased by flaring the silica tube 5 used beyond the microwave applicator 1. The microwave power densities required are however such that the use of a cooling liquid without dielectric loss is indispensable. This fluid flows in the applicator, in a double-walled distribution circuit that is extremely costly.

Moreover, the scale-up of this type of reactor presents technological limitations in terms of the maximum feasible diameter. In fact, the microwave power delivered by a unit generator cannot be increased substantially. The microwave generators available in DC mode at 2.45 GHz generally do not exceed 12 kW, which is insufficient for producing plasmas for the above applications.

Finally, the standard rectangular waveguides in single propagation mode used in microwave applicators have large sides not exceeding 8.6 cm, which corresponds to the European standard.

The solution whereby the excitation frequency is reduced and the ISM (Industrial, Scientific and Medical) frequency of 915 MHz is used, serves to increase the dimensions of the waveguides—in inverse relation to the frequencies—and to obtain unit DC power outputs of up to 30 kW.

However, this is not fully satisfactory. In fact, the dimensions of microwave components—such as the short-circuit plunger, impedance matchers, bi-couplers for power measurement—are commensurately increased. Hence it appears that the technological limits have now been reached and that the maximum substrate diameters that can be treated range from about 100 to 150 mm.

As regards the microwave discharges given by the microwave applicators of the cavity type, the same problems arise.

In fact, the scale-up of the cavity demands either switching to a multimode cavity which does not allow a uniform plasma to be obtained at the substrate, or reducing the microwave frequency to 915 MHz. Decreasing the frequency procures the same advantages as above, but also the same drawbacks. It is therefore only possible to treat substrates with a maximum diameter of about 100 to 150 mm.

PRESENTATION OF THE INVENTION

The invention proposes to overcome these drawbacks.

In particular, the invention relates to the production of a slice or sheet of plasma with large dimensions in the pressure range of 1 torr, that is, of a few millitorr to a few tens of torr.

The production of this slice or sheet takes place by microwave excitation of the gas, allowing the production of plasma on a volume depending on the operating conditions, that is the pressure and microwave power injected on each applicator.

For this purpose, the invention proposes a device for producing a plasma in a chamber comprising means for producing an energy in the microwave spectrum for the excitation of the plasma, said means comprising at least one basic plasma excitation device comprising a coaxial applicator of microwave energy, of which one end is connected to a production source of microwave energy, the other end being directed to the gas to be excited within the chamber, characterized in that each basic excitation device is arranged in the wall of the chamber, each applicator comprising a central core which is substantially flush with the wall of the chamber, the central core and the thickness of the wall of the chamber being separated by a space coaxial with the central core, this space being completely filled at least at one end of each applicator with a dielectric material such that said material is substantially flush with the level of the wall of the chamber.

The invention is advantageously supplemented by the following characteristics, taken alone or in any technically feasible combination thereof:
- the dielectric material is refractory;
- the dielectric material is made of an alloy of silica and/or of aluminum nitride and/or of alumina;
- the dielectric material fills the entire coaxial space;
- the length of the dielectric material is equal to an integral number of half-wavelength of the microwaves in the dielectric material;
- it comprises O-rings inserted between the dielectric, the central core of an applicator and the internal wall of the applicator;
- each O-ring is embedded in the internal and external walls of the coaxial structure;
- a central core terminates in a permanent magnet encapsulated in the central core and flush with the walls of the chamber;
- it comprises a dielectric plate that extends to the interior of the chamber on the internal wall thereof, said plate completely covering the plasma excitation devices;
- it comprises means for cooling each applicator in the chamber walls;
- it comprises means for cooling the applicators in the central core of each applicator;
- the pressure of the plasma is between a value of about 1 millitorr and a value of about a few tens of torr;
- it comprises a plurality of applicators, the applicators being arranged in a two-dimensional network in the wall of the chamber in order to obtain the desired applicator density for a desired pressure range.

PRESENTATION OF THE FIGURES

Other features, aims and advantages of the invention will appear from the description that follows, which is purely illustrative and non-limiting, and which should be read with reference to the drawings appended hereto in which:

FIG. 1, already discussed, shows an excitation applicator of the surface wave type according to the prior art;

FIG. 2, already discussed, shows a plasma excitation reactor of the cavity type according to the prior art;

FIG. 3 shows a cross section of one feasible embodiment of the invention comprising a single applicator;

FIG. 4 shows a cross section of one feasible embodiment of the invention comprising a plurality of applicators;

DETAILED DESCRIPTION OF THE INVENTION

Figure 1:
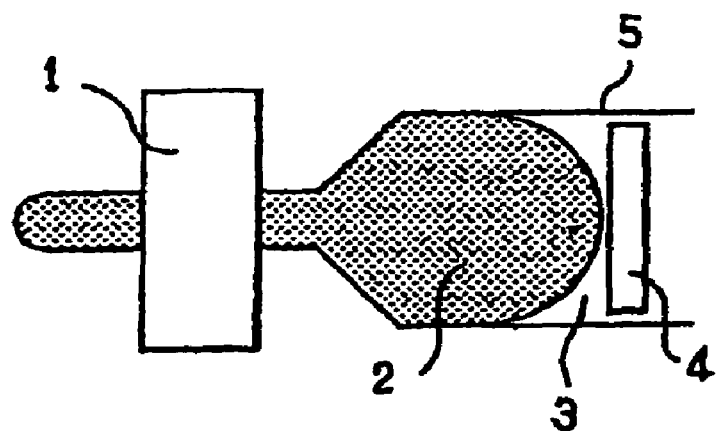
Figure 2:
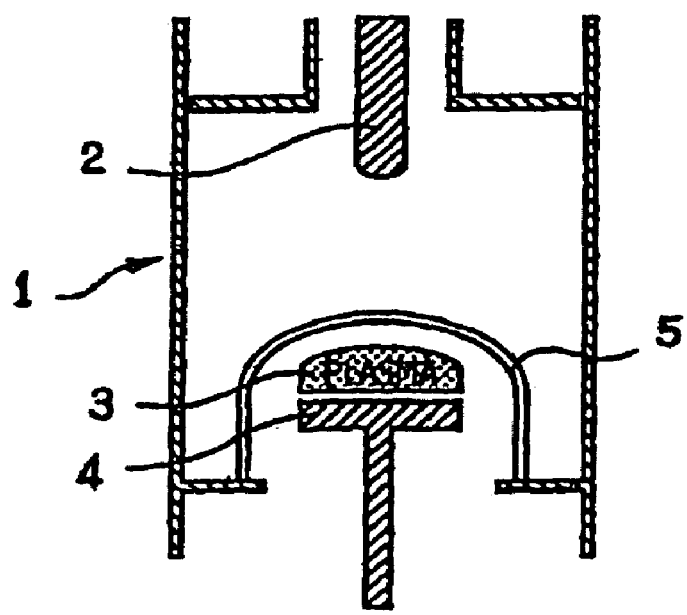

FIG. 3 shows one feasible embodiment of a device 1 for producing a plasma.

The device 1 conventionally comprises a sealed chamber 3 equipped with numerous gas introduction and gas pumping devices, not shown but known per se. The introduction and pumping devices serve to maintain the pressure of the gas that needs to be ionized at a desired value—it may, for example, be about a few tenths of a Pa or a few thousands of pascals, that is of about a few millitorr to a few tens of torr, depending on the type of gas and the excitation frequency.

Conventionally, the wall of the chamber 3 is metallic.

According to this feasible embodiment of the invention, the production device 1 comprises a basic excitation applicator 4.

According to a variant of this embodiment shown in FIG. 4, the plasma production device comprises a series of basic devices or applicators 4 for exciting a plasma 16. The applicators 4 are distributed as a function of the density and internal pressure of the chamber.

According to the invention, each basic plasma excitation device 4 consists of a coaxial microwave power applicator comprising a central core 5 surrounded by a cavity 6 added on or directly perforated in the wall of the chamber 3.

Preferably, the central core 5 and the cavity 6 surrounding it have a symmetry of revolution.

One of the ends of the applicator 4 is connected to an energy source 7 in the microwave spectrum and outside the chamber 3.

The other end 8 of the applicator 4 is free and terminates inside the chamber 3. It is in contact with the gas present in the chamber 3.

The propagation of the microwave energy from the energy source 7 to the free end 8 takes place in the cavity 6 surrounding the central core of the applicator.

In general, the central core 5 of each applicator 4 is cooled by a water circulation circuit (not shown in the figures).

Similarly, FIGS. 3 and 4 show that the spaces 12 between the applicators 4 of the wall 3 are generally cooled by water circulation through 13.

Figure 5:
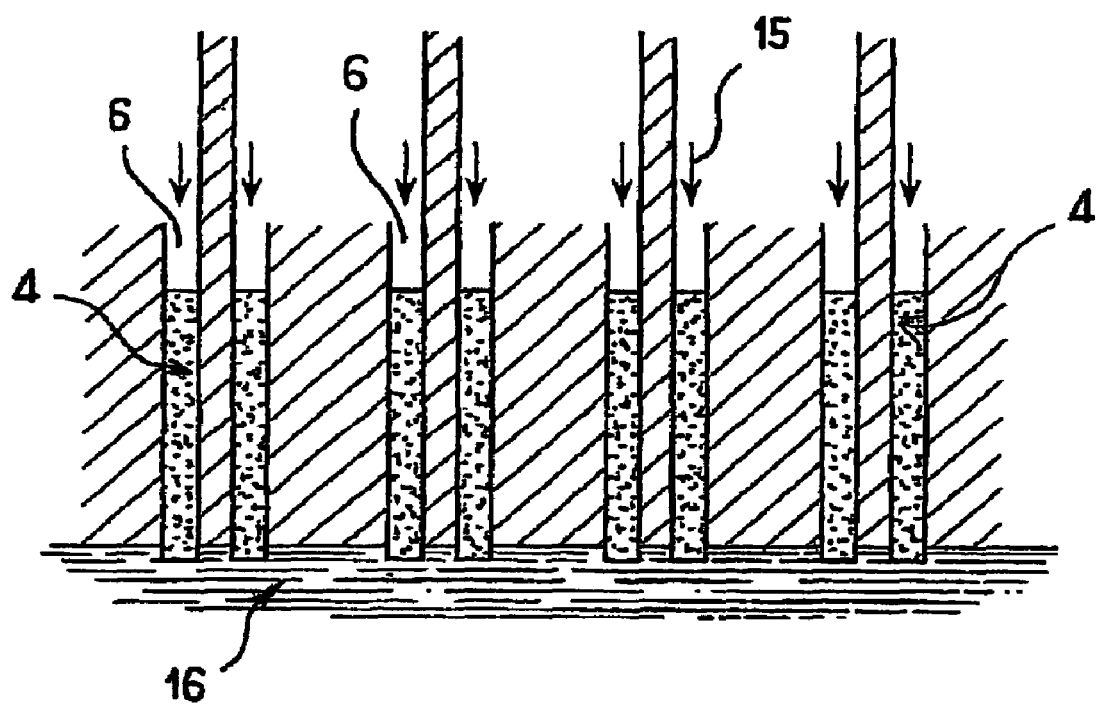
FIG. 5 shows a close-up arrangement of the applicators.

A dielectric material 14 in the solid state is arranged inside the cavity 6 around the central core 5. The dielectric 14 is arranged on the side of the free end 8 of the applicator 4, substantially at the level of the chamber wall. It may slightly project from the chamber wall 3 or be slightly embedded as regards the level of the chamber wall 3, which is preferably substantially flush with the level of the end of the central core 5 in contact with the plasma, as shown in FIG. 5.

According to one variant, it may fill the entire space between the central core and the inside wall of the cavity.

Preferably, the length of the dielectric material is equal to a whole number of half-wavelength of the wave in the dielectric, in order to compensate for the reflections and recompositions of the waves at the interfaces. The length l of the dielectric is defined by:

$$\sqrt{\in_r} \times l = k \times \lambda/2$$

where: $\in_r$ is the relative permittivity of the dielectric material
k is an integer
λ is the wavelength of the wave in the vacuum.

The dielectric 14 is advantageously a "low loss" dielectric. It is preferably refractory in order to withstand the high temperatures of certain envisioned applications. It can be made of an alloy, for example, of aluminum nitride (AlN), and/or of alumina ($Al_2O_3$), and/or of silica ($SiO_2$).

The arrows 15 in the FIGS. 3, 4 and 5 represent the microwave propagation in the cavity 6 of each applicator 4. They propagate toward the interior of the chamber 3 and excite the plasma 16 present in said chamber 3.

FIGS. 4 and 5 serve to compare the influence of the spacing of the applicators with respect to one another on the formation of the plasma.

A relatively low density of applicators per unit area is needed to produce a uniform plasma when the gas pressure is relatively low. In fact, the plasma diffuses more easily when the gas pressure is not high. In this case, only one applicator 4 is necessary to produce the plasma on a given dimension.

By contrast, the higher the gas pressure, the more locally the plasma is produced. The plasma will not be uniform if the applicators are too remote, as in FIG. 4. A relatively high density of applicators per unit area is therefore necessary, the applicators also being distributed as uniformly as possible.

This is also why the dielectric material is situated at the end of the applicator, and not set back from at this end. This avoids the formation of plasma inside the applicator (coaxial zone, use side) throughout the accessible pressure range.

The applicators 4 can be arranged in various networks.

Figure 6:
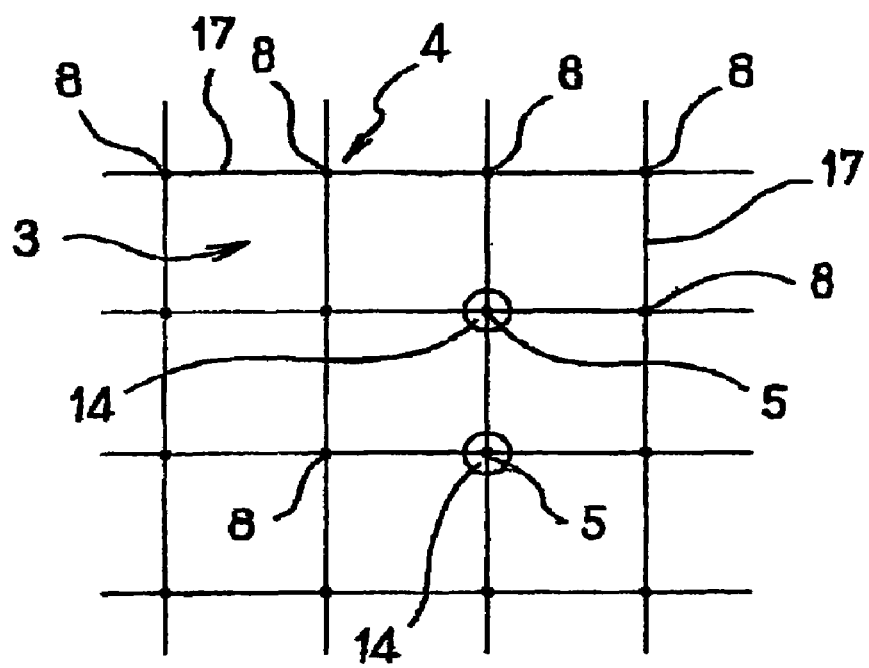
FIG. 6 is a front view of a square two-dimensional network of applicators.

FIG. 6 shows a front view of the inside wall of the chamber 3. It shows the network arrangement of the free ends 8 of the applicators 4. In this square network, the distance 17 between two free ends 8 defines the network density.

Figure 7:
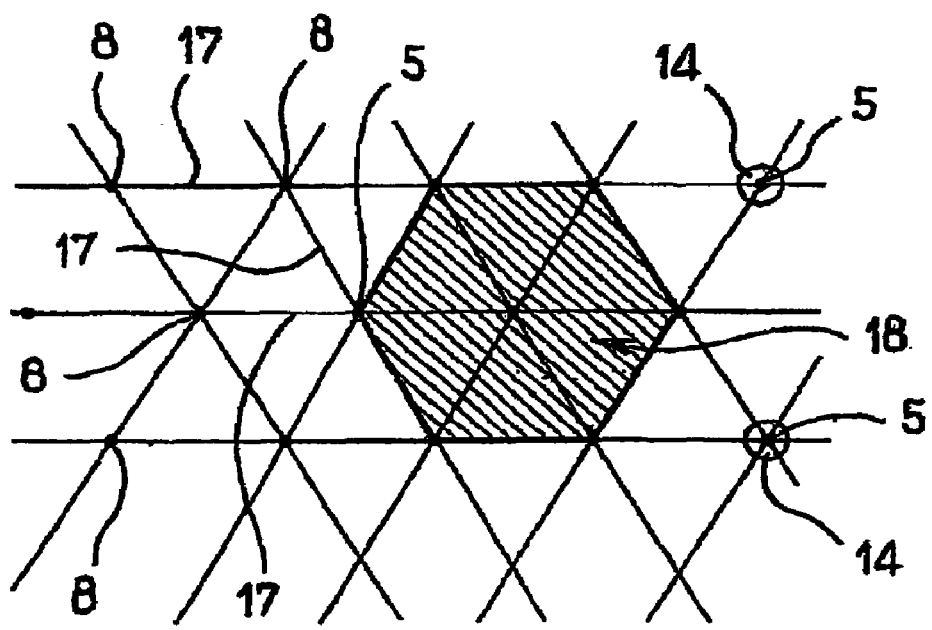
FIG. 7 is a front view of a hexagonal two-dimensional network of applicators.

FIG. 7 shows that for the same distance 17 between two free ends 8, a hexagonal network arrangement—indicated by the numeral 18 in the figure—serves to obtain a higher density per unit area of the applicators 4.

A higher density permits a better uniformity of the applicators 4, and consequently better uniformity of the plasma produced thereby. A higher microwave power density per unit area can also be supplied, at maximum power given by the applicator 4.

For reasons of clarity, FIGS. 6 and 7 only show two ends of applicators 4. The ends 5 are distinguished from the central cores, as well as the dielectric materials 14.

To obtain a uniform plasma sheet 16 with very large dimensions, it is first necessary to be able to distribute the microwave power as uniformly as possible throughout the applicators 4.

For this purpose, it is possible to use a microwave power generator that is adjustable by applicator. For example, a transistorized microwave source can be used for each applicator.

It is also possible to use a single microwave power generator and then divide this power to distribute it to each applicator 4. The microwave power injected into each applicator 4 can be adjusted easily and independently by an impedance matcher, arranged just upstream of each applicator 4.

Certain deposition or treatment methods require a high temperature of the application surface. Others require lower temperatures.

It should be recalled that the portions 12 located between two applicators, as well as the central cores 5, are cooled by cooling circuits using fluids, particularly water.

In consequence, it is possible for the gases constituting the plasma to be cooled by contact with the cooled surfaces of the chamber 3, and then in turn to cool the application surface.

Thus, independent heating of an application surface is provided, particularly for depositing diamond.

Figure 8:
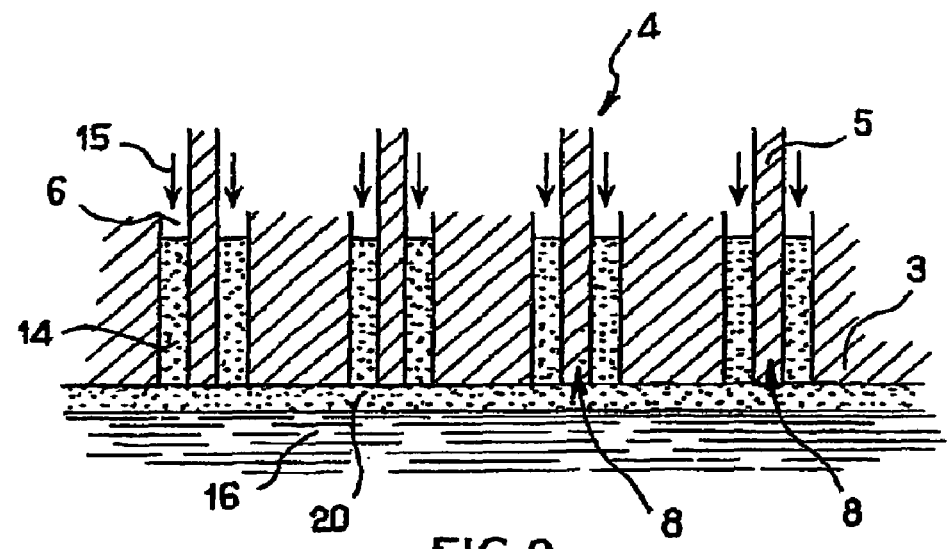
FIG. 8 shows the covering of the reactor wall with a dielectric plate.

FIG. 8 shows that a low-loss dielectric plate 20 (like silica, for example) can also be inserted between the cooled portions of each applicator and the plasma, to avoid the cooling of the plasma in contact with the surfaces cooled by the circulation of fluid. The dielectric plate 20 can cover all or a portion of all the free ends 8 of the applicators 4.

Figure 9:
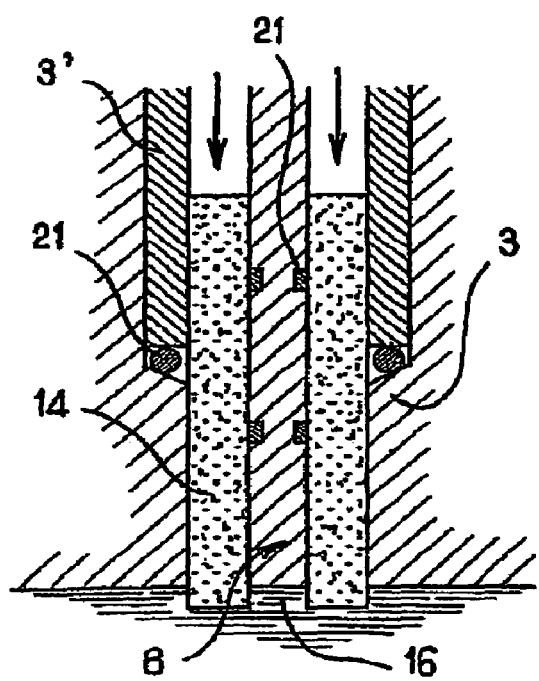
FIG. 9 shows a feasible embodiment of the assembly of O-rings.

FIG. 9 shows that O-rings 21 provide a seal between the upstream (atmosphere) and downstream (plasma) portions of the applicators 4.

The O-rings 21 are preferably embedded in the central core 5 and between the walls of the chamber 3 and the gland 3', to prevent their heating by the passage of microwaves. Moreover, this type of embedding also serves to guarantee better cooling, because they benefit from the cooling distribution circuit present in the wall 3 and in each central core 5.

The device according to the invention shown in FIGS. 1 to 9 advantageously applies to the range of medium pressures (about a few tenths of a pascal to a few thousand pascals, that is, about a few millitorr to a few tens of torr).

However, in order to extend the use of the invention for a plasma excitation in the low pressure range (about $10^{-2}$ torr), a variant of the device can be provided.

Figure 10:
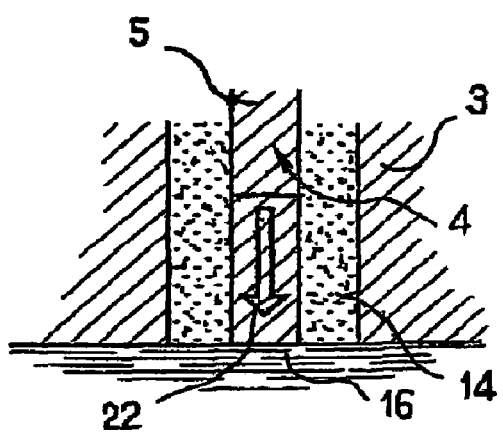
FIG. 10 shows an improvement of an embodiment of the invention comprising a permanent magnet at the end of the applicator.

In this variant, shown in FIG. 10, a permanent magnet 22 is placed at the end of the central core 5 of the applicator 4, the axis of permanent magnetization of which is advantageously along the axis of the central core. This magnet 22 is encapsulated in the central core 5. The free end of the magnet is substantially at the level of the free end of the wall 3 in contact with the plasma 16.

With such a permanent magnet 22, it is easier to start the plasma in the range of the lower pressures considered by the present invention, by virtue of the confinement of the plasma or of the presence of an ECR (Electron Cyclotron Resonance) zone near the pole of the magnet.

Each permanent magnet 22 may be conventional, for example made of samarium-cobalt, of neodymium-iron-boron, or even of barium ferrite and strontium ferrite.

The plasma reactor described in the present application comprises means for pressure measurement and for desired plasma diagnosis (not shown in the figures).

Similarly, a substrate holder used for the methods put into practice comprises heating or cooling means as well as all the means (continuous, pulsed, low-frequency or radiofrequency means) for biasing the substrate necessary for the method employed.

ADVANTAGES OF THE INVENTION

One of the advantages provided by the present invention is the possibility of scale-up of the plasma sheets produced by said described technology and of producing dense plasmas in the pressure range defined in the invention.

Only a single applicator can be used.

Yet there is no limitation to increasing the number of applicators.

The applicators can be arranged in any geometry, and adapt to any configuration of the chamber, particularly cylindrical.

Similarly, it is possible to supply microwave power to as many applicators as desired by as many independent generators as necessary with or without power division.

Each applicator can be supplied via a coaxial cable, because the microwave power necessary for each applicator is relatively low, hence, the great dependability of the overall device.

A further advantage is that the microwave applicators are easy to cool by fluid circulation in the metal portion of the applicators. There is no need to supply a low-loss dielectric fluid as in the case of the surface wave discharges of the prior art.

Finally, it is easier to control the plasma/surface interaction parameters than in the devices of the prior art.

For example, if one considers a square network of coaxial microwave applicators, for example with a 16 mm inside diameter of the outer conductor arranged every two centimeters, the area of each applicator is 4 $cm^2$. This area is reduced to about 3.5 $cm^2$ in the case of a hexagonal structure.

In the case of a 2 cm thick plasma sheet, fixed for example by the applicator/application surface distance, the volume of plasma created by each applicator is 8 $cm^3$ for a square network, and 7 $cm^3$ for a hexagonal network.

For a microwave power of 200 W per applicator, the maximum power density supplied to the plasma is 25 W/cm$^3$ for a square network, and 28.5 W/cm$^3$ for a hexagonal network.

In both cases, it is thereby possible to apply up to 5 kW per area of 100 mm×100 mm for a square network, or 25 applicators and slightly more for a hexagonal network.

A further advantage is the simplicity of construction of each basic applicator.

The microwave frequency used is not critical, and it is possible to use one of the ISM (Industrial, Scientific and Medical) frequencies such as 915 MHz or 2.45 GHz, or any other frequency.

The invention claimed is:

1. A device for producing a plasma in a chamber comprising means for producing an energy in the microwave spectrum for the excitation of the plasma, said means comprising at least one basic plasma excitation device comprising a coaxial applicator of microwave energy, of which one end is directly connected to a production source of microwave energy, the other end being directed to the gas to be excited within the chamber, wherein each basic excitation device is arranged in the wall of the chamber, applicator comprising a central core which is substantially flush with the interior surface of the wall of the chamber, the central core and the thickness of the wall of the chamber being separated by a space coaxial with the central core, this space being completely filled at least at one end of said applicator with a solid dielectriic material such that said material is substantially flush with the interior surface of the wall of the chamber.

2. The device as claimed in claim 1, wherein the dielectric material is refractory.

3. The device as claimed in claim 2, wherein the dielectric material is made of an alloy of silica and/or of aluminum nitride and/or of alumina.

4. The device as claimed in claim 1, wherein the dielectric material fills the entire coaxial space.

5. The device as claimed in claim 1, wherein the length of the dielectric material is equal to an integral number of half-wavelength of the microwaves in the dielectric material.

6. The device as claimed in claim 1, further comprising o-rings inserted between the dielectric, the central core of an applicator and the internal wall of the applicator.

7. The device as claimed in claim 6, wherein each O-ring is embedded in the internal and external walls of the coaxial structure.

8. The device as claimed in claim 1, wherein a central core terminates in a permanent magnet encapsulated in the central core and flush with the walls of the chamber.

9. The device as claimed in claim 1, further comprising a dielectric plate that extends to the interior of the chamber on the internal wall thereof, said plate completely covering the plasma excitation devices.

10. The device as claimed in claim 1, further comprising means for cooling each applicator in the chamber walls.

11. The device as claimed in claim 1, further comprising means for cooling the applicators in the central core of each applicator.

12. The device as claimed in claim 1, wherein the pressure of the plasma is between a value of about 1 millitorr and a value of about a few tens of torr.

13. The device as claimed in claim 1, further comprising a plurality of applicators, the applicators being arranged in a two-dimensional network in the wall of the chamber in order to obtain the desired applicator density for a desired pressure range.

14. The device of claim 1, wherein a common single source of microwave energy is connected to said one end of a plurality of coaxial applicators.

15. The device of claim 1, wherein a source of microwave energy is connected respectively to said one end of each coaxial applicator.

* * * * *

UNITED STATES PATENT AND TRADEMARK OFFICE
CERTIFICATE OF CORRECTION

PATENT NO.        : 7,574,974 B2                                     Page 1 of 1
APPLICATION NO.   : 10/516998
DATED             : August 18, 2009
INVENTOR(S)       : Lagarde et al.

It is certified that error appears in the above-identified patent and that said Letters Patent is hereby corrected as shown below:

Column 7:

Claim 1, line 9, before "applicator" insert -- said --
Claim 1, line 15, delete "dielectriic", insert -- dielectric --

Signed and Sealed this
Twelfth Day of April, 2011

David J. Kappos
*Director of the United States Patent and Trademark Office*